United States Patent [19]

Moran et al.

[11] 4,225,664
[45] Sep. 30, 1980

[54] X-RAY RESIST CONTAINING POLY(2,3-DICHLORO-1-PROPYL ACRYLATE) AND POLY(GLYCIDYL METHACRYLATE-CO-ETHYL ACRYLATE)

[75] Inventors: Joseph M. Moran, Berkeley Heights; Gary N. Taylor, Fanwood, both of N.J.

[73] Assignee: Bell Telephone Laboratories, Incorporated, Murray Hill, N.J.

[21] Appl. No.: 14,243

[22] Filed: Feb. 22, 1979

[51] Int. Cl.$^2$ .......................... G03C 1/71; B05D 3/06
[52] U.S. Cl. ................................. 430/306; 427/43.1; 204/159.16; 428/451; 428/522; 430/280; 430/286; 430/910; 525/208
[58] Field of Search ................ 428/451, 522; 427/43; 525/913, 208; 430/280, 286, 910, 306; 204/159.16

[56] References Cited

U.S. PATENT DOCUMENTS

| | | | |
|---|---|---|---|
| 4,061,829 | 12/1977 | Taylor | 428/451 |
| 4,068,018 | 1/1978 | Hashimoto | 427/43 |
| 4,096,290 | 6/1978 | Fredericks | 427/43 |
| 4,125,672 | 11/1978 | Kakuchi | 427/43 |
| 4,130,424 | 12/1978 | Feit | 427/43 |
| 4,133,907 | 1/1979 | Brewer | 427/43 |

OTHER PUBLICATIONS

G. N. Taylor, "Sensitive Chlorine–Containing Resists for X-ray Lithography," *Poly. Eng. and Sci.*, Jun. 1977, vol. 17, No. 6, pp. 420–429.

L. F. Thompson, "Lithography and Radiation Chem. of Epoxy Containing Negative Electron Resists," *Poly. Eng. and Sci.*, 14, pp. 529–533, (Jul. 1974).

Sonja Krause, "Polymer Compatibility," *J. Macromol. Sci.-Revs. in Macromol. Chem.*, C7 (2), pp. 251, 292–309, (1972).

*Primary Examiner*—Ellis P. Robinson
*Attorney, Agent, or Firm*—Richard D. Laumann

[57] ABSTRACT

A mixture of poly(2,3-dichloro-1-propyl acrylate) and poly(glycidyl methacrylate-co-ethyl acrylate), with the latter forming between 1 percent and 20 percent by weight, of the total polymer mixture, has been found to form an x-ray resist having adhesive and resolving properties superior to those of poly(2,3-dichloro-1-propyl acrylate) which is a good x-ray resist material. Superior properties of the mixture are attributed to the fact that the two polymers form a compatible polymer mixture which is a relatively rare and unpredictable event in polymer chemistry.

26 Claims, No Drawings

4,225,664

X-RAY RESIST CONTAINING POLY(2,3-DICHLORO-1-PROPYL ACRYLATE) AND POLY(GLYCIDYL METHACRYLATE-CO-ETHYL ACRYLATE)

TECHNICAL FIELD

This invention is concerned with high resolution patterned images and their production with negative x-ray resists.

BACKGROUND OF THE INVENTION

Production of high resolution patterned images used in the fabrication of miniaturized circuits depends upon the exposure of selected portions of a radiation curable material, commonly called a resist, to incident radiation which initiates reactions within the exposed portion of the resist causing it to become more or less easily removed with respect to the unexposed portion when developed. Typically, resists are coated onto substrates composed of materials used in the manufacture of large scale integration devices, etc. For polymeric resists, the reactions are generally either crosslinking or chain scission. If the reaction is crosslinking, the polymer material is generally called, following photographic terminology, a negative resist because the crosslinking renders the exposed portion relatively insoluble with respect to the unexposed portion and permits removal of the unexposed portion of the resist during development. After development, the now bared substrate may be modified by removal of substrate material or by deposition of new material. In production of typical devices, for example, semiconductor integrated circuits, the described processing sequence will be repeated several times, i.e., the crosslinked resist is stripped off and after subsequent processing of the substrate layers, a new layer of resist is put down and exposed, etc.

Selected portions of the resist coated substrate may be exposed in any of several ways. For example, selected portions of the resist may be sequentially illuminated by a scanning radiation source. Alternatively, a radiation source that exposes all of a mask covered with a pattern formed by material opaque to the radiation may be used to illuminate selected portions of the resist material. The radiation used may be electrons or electromagnetic radiation in the visible, ultraviolet or x-ray region. X-rays and electrons, having wavelengths shorter than radiation in the visible or ultraviolet regions, afford the promise of higher resolution patterned images. X-ray lithography is one of a number of technologies currently being investigated for the fabrication of very high resolution semiconductor devices. In addition to the promise of high resolution, x-ray lithographic systems are potentially both inexpensive and comparable in simplicity with optical proximity printing systems. The entire wafer can be exposed in one step and resolution is not limited by scattering, diffraction effects, standing waves or reflections from the substrate.

A successful lithographic system depends upon the availability of a resist having both good sensitivity to the incident radiation and good adhesion to the substrate. The former requirement is imposed by the necessity of having rapid throughput and the latter requirement is imposed by processing steps including resist pattern development and substrate etching. The first x-ray resist materials were generally polymers such as poly(methyl methacrylate) and poly(glycidyl methacrylate-co-ethyl acrylate) developed primarily as electron beam resists. The latter material, often referred to as COP, has excellent sensitivity to electron beam radiation and good adhesion properties.

However, these materials generally have a sensitivity to x-ray radiation that is too low for practical x-ray lithographic systems and resists were developed specifically for x-ray lithography. U.S. Pat. No. 4,061,829, issued on Dec. 6, 1977, to G. N. Taylor describes a class of chlorinated or brominated polymeric negative resists for x-ray lithography. Good sensitivity to x-rays is obtained by these resists primarily, it is believed, because chlorine and bromine atoms have a generally high mass absorption coefficient for x-rays and can be incorporated into the polymer in high weight percents. Within the class of poly(chloroalkyl acrylates) described, poly(2,3-dichloro-1-propyl acrylate), commonly referred to as DCPA, was found to exhibit the best overall properties as an x-ray resist. Improvement in both the resolving and adhesive properties of the resist would be particularly desirable for the cases when 1 micron initial and 0.5 micron final thickness films of DCPA are required to obtain better step coverage on integrated circuit wafers than thinner films would provide.

It might be thought possible to improve both adhesion and resolution by simply mixing DCPA with another polymer or x-ray resist having either or both better adhesion and resolution. However, mixtures of two or more polymers generally are not compatible. Phase separation of the polymers occurs when they are not compatible. Compatibility of any polymer mixture used as a resist material is important because the phase-separated regions are likely to lead to defects which can decrease resolution or adhesion of the final patterned film. In the phase separated regions there are, in effect, two resists present and the different radiation sensitivities of the two resists can result in different amounts of crosslinking in exposed areas. After development, there may be undeveloped spots, opaque spots or edge roughness in the pattern.

It is generally difficult, if not impossible, to predict the compatibility of those polymers that do form compatible mixtures. This difficulty becomes more pronounced when one or more of the polymers in the mixture has a high weight average molecular weight ($\overline{M}_w$). DCPA, when used as an x-ray resist, has $\overline{M}_w$ desirably between 300,000 and 3,500,000 g/mole.

SUMMARY OF THE INVENTION

It has been found that a mixture of DCPA and COP, the latter forming between 1 percent and 20 percent by weight of the mixture, is useful as a negative x-ray resist for the production of patterned images. The mixture has both improved adhesion and resolution compared to DCPA. The improvement in resolution and adhesion is optimum when COP constitutes approximately 7.5 percent by weight of the total mixture. Studies of mixtures of DCPA and COP using measurements of the glass transition temperature and vapor absorption measurements, among others, indicate that the polymers are compatible throughout the range of weight percents mentioned.

DETAILED DESCRIPTION

The described x-ray resist, or x-ray curable material, is a mixture of DCPA and COP with the latter's weight percent of the total mixture being between approximately 1 percent and approximately 20 percent. Below 1 weight percent, neither resolution nor adhesion is better than for a resist consisting of only DCPA. Above 20 weight percent, the x-ray sensitivity of the resist decreases to such an extent that the usefulness of the resist is significantly reduced. As mentioned previously, COP is a copolymer of ethyl acrylate and glycidyl methacrylate. The ratio of the mole percents of glycidyl methacrylate to ethyl acrylate is desirably within the range from 85:15 to 50:50. COP as used in this specification, means a copolymer having a composition within this range. A ratio of approximately 70:30 has been found to yield best results. It has been found that the optimum results are obtained when the resist composition is approximately 92.5 weight percent DCPA and 7.5 weight percent COP. Compositions with lower weight percentages of COP show a decrease in adhesion and compositions having higher weight percentages do not appear to have better adhesion.

DCPA, as used in this specification, is an abbreviation for a polymer, poly(2,3-dichloro-1-propyl acrylate), prepared from a monomer represented by the formula

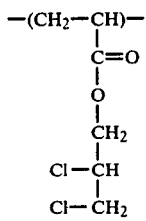

The polymer may include small weight percents, less than approximately two percent, of a second monomer such as glycidyl methacrylate or glycidyl acrylate. The properties of DCPA and suitable methods for making DCPA are described in U.S. Pat. No. 4,061,829. The properties of COP and suitable methods for making COP are described in *Polymer Engineering Science*, 14, 529 (1974).

The weight average molecular weight of the DCPA used in the mixture desirably falls within the range extending from 300,000 g/mole to 3,500,000 g/mole. A convenient value is approximately 2,900,000 g/mole. The weight average molecular weight of the COP used in the mixture desirably falls within the range extending from 20,000 g/mole to 500,000 g/mole. A convenient value is approximately 150,000 g/mole. The preferred dispersity, weight average molecular weight divided by number average molecular weight, for DCPA is approximately 3.26, that is 3.26 plus or minus 10 percent, and for COP is 2.2 plus or minus 10 percent.

The mixtures of DCPA and COP forming the resist are conveniently prepared by mixing solutions of each polymer dissolved in suitable solvents. Chlorobenzene has been found to yield satisfactory results as a solvent for both polymers. After combining the two solutions, the mixture is agitated by a suitable technique such as with a magnetic spinbar or a mechanical shaker. A suitable homogeneous mixture is obtained after a relatively brief period, typically one-half to one hour. Although the mixture can itself be filtered through a suitable filter, typically having 0.20 micron pores, it has been found easier and more convenient to mix DCPA and COP solutions which have been filtered separately to the same degree. Choice of either method does not result in any detectable difference in defect density.

The substrates are conveniently coated by spincoating. A thickness of approximately 1 micron results from spincoating at 1500 revolutions per minute. 0.5 micron represents the minimum thickness needed for useful patterning results with a planar surface. If the surface is not planar, i.e., if the resist is applied to a surface containing features, approximately 1 micron represents the minimum useful resist thickness. Substrates may be semiconductors, e.g., silicon, and may or may not be covered with an oxide layer of, e.g., silicon oxide. Excess solvent is removed from the resist and optimum adhesion to the substrate is obtained by vacuum-baking, at a pressure of approximately 0.1 torr, the coated substrate prior to exposure. The typical baking temperature is 90 degrees C., plus or minus 10 degrees C., for approximately one-half hour, plus or minus 15 minutes. However, if the resist is not adequately prebaked, there appears to be a slight decrease in adhesion. Too much prebaking appears to result in the appearance of some slight fogging of the clear areas upon exposure and development.

A patterned mask formed from a material relatively transparent to the x-rays used is placed close, for example, 40 microns, to the resist-covered substrate and exposed to x-rays from a source that is typically 50 cm. from the mask. The portion of the resist not shadowed by the pattern is exposed to the x-rays and the exposed resist crosslinks. Typical mask substrate materials include polyethylene terephthalate, silicon, KAPTON (poly[N,N/-(P,P/-oxydiphenylene) -pyromellitimide]) and beryllium. Silicon masks are less advantageously used than are the other mask materials as silicon has an absorption edge at 6.74 Angstroms which limits its usefulness for x-rays of shorter wavelength. Gold and platinum, because of their high x-ray absorption coefficients, are exemplary materials for forming the desired masking pattern on the mask substrate.

The x-ray absorption of chlorine atoms is high near 4.4 Angstroms and the x-rays forming the incident radiation should have a large component of their total energy near that wavelength or at shorter wavelengths. The K shell absorption edge causes the x-ray absorption to drop rapidly immediately above 4.4 Angstroms. The considerations regarding the design of an x-ray source are discussed in U.S. Pat. No. 4,061,829 and in U.S. Pat. No. 3,892,973, issued on July 1, 1975, to Coquin et al. Palladium is an especially efficient target material because of the Pd $L_\alpha$ line at 4.37 Angstroms. Exposure times actually used depend in a well-known manner upon system details.

The contrast of the resist is an important resist property as it characterizes the ability of the resist to distinguish between the exposed and unexposed areas. For a negative resist, the contrast $\gamma$, is defined as the slope of the linear portion of a plot of the normalized film remaining as a function of log dose. To be suitable as a resist, the polymer should have a $\gamma$ of at least 0.8 to yield adequate resolution for a 1 micron thick resist. This number also depends upon the mask contrast and with higher values for the mask contrast, lower values of $\gamma$ yield adequate resolution. Typical values for masks used were 6–7:1. Typical values for $\gamma$ of the resists of this invention were 1.15±10 percent. Sensitivity of the resist to x-ray radiation, as determined by measuring resist thickness after exposure and development, was typically 8 mJ/cm$^2$±20 percent. While adhesion and resolution are improved by the addition of COP to DCPA, the sensitivity and contrast of the resulting resist are adversely affected with respect to the same properties of DCPA. Resolution is limited to approximately 2 microns for the gap feature, beginning with the 1-micron resist thickness, because of resist swelling encountered during the solvent development process.

The compatibility of the polymer mixture for mixtures containing up to 20 weight percent, with respect to the total polymer mixture, COP was established by measurements of, for example, the glass transition temperature and vapor absorption to obtain the Flory-Huggins interaction parameter. These measurements indicated that the polymers formed a compatible mixture. Measurements of the glass transition temperature resulted in the observation of only one $T_g$ for each mixture rather than the two glass transition temperatures that would be expected to be observed if the mixture were not compatible. Vapor absorption measurements also showed that the polymers formed a compatible mixture. Compatibility exists within the above-mentioned weight percents for the polymer mixture for COP having a ratio of the mole percent of glycidyl methacrylate:ethyl acrylate within the range from 85:15 to 50:50. Binary mixtures of DCPA and poly(glycidyl methacrylate) or poly(ethyl acrylate) are not compatible.

After exposure, the resist is developed, that is, the unexposed portions are removed. A wet development technique has been found to yield good results. After development, the substrate is blown dry and plasma cleaned to remove any residual resist remaining in the clear areas on the substrate. The now pattern-delineated resist and bared substrate may undergo the further processing entailed in the fabrication of devices such as LSI circuits, masks or bubble devices. The processing may involve well-known steps as deposition of material on or in the substrate by, for example, ion implantation or diffusion, or removal of a layer of the bared substrate. After removal of the layer, further material may be deposited by, for example, ion implantation or diffusion.

A typical processing sequence applicable to semiconductor devices, and with suitable and well-known modifications to other devices, will be described briefly. A semiconductor substrate such as silicon or gallium arsenide is covered with a layer of $SiO_2$ which in turn is coated with a layer of the resist. After patterning the resist, the bared oxide layer is removed, typically by etching in a buffered HF solution. Dopants may now be put into the bared semiconductor substrate with techniques such as diffusion or ion implantation. If diffusion is used, it has been found desirable to remove the resist prior to diffusion. The $SiO_2$ layer prevents diffusion in the unwanted areas. The remaining resist, if any, is now stripped off and a new oxide layer formed and coated with resist. The processing sequence is now repeated. The last processing sequence usually involves a metal layer, such as aluminum, which is pattern-delineated to provide contacts to and between the circuit elements and components.

Good step coverage is obtained with a feature containing substrate by coating the substrate with a plasma etch resistant resist to yield a planar surface. This surface is then coated with an oxide layer, e.g., silicon dioxide, and the x-ray resist material. The resist is exposed and developed as described. After the oxide layer has been removed in the desired places, the resist adjacent the substrate may be plasma etched and the substrate processed as desired. Initial thicknesses of 0.6 $\mu$m yield a final developed thickness of 0.3 $\mu$m and resolution better than 2 $\mu$m.

A suitable developing spray is formed by a mixture of methyl ethyl ketone (MEK) and isopropyl alcohol (IPA). Successive sprays of 4:1, 3:2 and 2:3, parts by volume of MEK and IPA, respectively, are used. Spray times are typically thirty seconds for each step. The last spray is followed by a dry air treatment for approximately 30 seconds. It has been found that three sprays yield better resolution than that obtained with one spray because the problems caused by resist swelling during development are reduced.

Wet and dry etching considerations will be discussed in some detail. $SiO_2$ and P-glass are hydrophilic and require prior treatment to promote resist adhesion. Although only $SiO_2$ will be referred to in the following description, it is to be understood that P-glass receives the same treatment. After $SiO_2$ deposition, it has been found desirable to bake the wafers in air for approximately one-half hour at 190 degrees C. and then coat them first with hexamethyldisilazane (HMDS) and then with the resist as previously described. After development, samples are again baked at approximately 190 degrees C. for about two hours and then etched with buffered hydrofluoric acid for times up to eleven minutes. The etch rate at 31 degrees C. was 1000 Angstroms per minute.

X-ray mask replication typically uses a mask substrate covered with layers (in order) of Ti, Ta or Au, Ti/Ta and the resist. After the resist has been pattern-delineated, now bared areas of the Ti/Ta layer are removed with plasma etching to expose the Au layer. The Au layer is removed by ion milling in a mixture of argon and oxygen with the Ti/Ta layer acting as a mask. Chemical etching of the Au is less desirable than ion milling because of the resulting undercutting. Other masks have a glass substrate covered with a reflective metal layer and are used in photolithography.

Different factors are important depending upon whether wet or dry etching is used to delineate patterns in the substrate layer. The adhesion requirements for the resist when dry etching is used are less severe than for wet etching because the buffered hydrofluoric acid solution tends to lift the resist in the wet etching process. The plasmas used in dry etching have a lesser and different effect as they erode the resist while wet etches attack the resist-substrate interface. For plasmas, the resist erosion rate is more important than the adhesion requirements. Consequently, when the substrate layer is patterned by plasma etching the HMDS layer is not generally required prior to resist deposition and the resist can be baked after pattern development at a temperature lower than used with wet etching. Etching is conveniently done in a mixture of 60 percent $C_2F_6$ and 40 percent $CHF_3$ at a pressure of approximately 1 torr. With a substrate etch rate of approximately 800 Angstroms/minute, the etch time is approximately 12 minutes. The resist loss for this process is approximately 270 Angstroms/minute.

Aluminum is etched conveniently with a wet etch technique employing 77 percent phosphoric acid, 15 percent acetic acid and 3 percent nitric acid added to de-ionized water (5 percent). The mixture is maintained at a temperature of approximately 42 degrees C. and a 1.5 micron-thick film etches isotropically in approximately five minutes. Adhesion is promoted if the resist is baked at 190 degrees C. for four hours prior to etching. The resist has a mild reaction with the aluminum and forms a thin layer of material, approximately 50 Angstroms, that is impervious to the etch. Consequently, prior to etching it is desirable to use a brief $O_2$ plasma flash to remove the material still remaining in the nominally clear areas but with a negligible loss of x-ray resist in the exposed areas.

Polysilicon is conveniently plasma-etched in a radial flow etcher that uses a mixture of 92 percent $CF_4$ and 8 percent $O_2$ at a pressure of 1.0 torr. A five-minute etch removed 0.5 microns of polysilicon with a resist loss of 0.2 microns. The etch appears to be isotropic. Adhesion of the resist to polysilicon is promoted by baking, after development, at 140 degrees C. for thirty minutes.

Resist stripping may be expediently accomplished in either of two ways. A mixture of five parts concentrated $H_2SO_4$ and one part $H_2O_2$ at 90 degrees C. stripped a 0.50 micron-thick resist in less than ten minutes. However, this method cannot be used for the aluminum level since the etch will attack aluminum. At this stage, the preferred method for stripping is an $O_2$ plasma at 1.0 torr. A 1 micron thick resist was stripped in 10 minutes in an unshielded $O_2$ plasma.

Example: A 7 weight percent solution of poly(2,3-dichloro-1-propyl acrylate) was prepared by dissolving 47.8 gm of the polymer in 635.7 gm of chlorobenzene. The polymer had a weight average molecular weight of 2,900,000 g/mole and a dispersity of 3.26. A homogeneous solution was obtained by shaking and stirring for one day. 32.1 gm of a 12 weight percent solution of COP in chlorobenzene was added to the DCPA solution. The COP had a 70:30 molar composition of glycidyl methacrylate:ethyl acrylate, a weight average molecular weight of 150,000 g/mole and a dispersity of 2.29. The resulting solution contained, by weight, 6.7 parts DCPA, 0.5 parts COP and 92.8 parts chlorobenzene. A silicon wafer was coated with a 1 micron thick layer of resist by spincoating at 1500 rpm. The wafer was vacuum dried at 90 degrees C. for 30 minutes and exposed to 10.3 mJ/cm$^2$ of PdL x-ray radiation through an x-ray mask. Development was by successive sprays of 4:1, 3:2 and 2:3 mixtures by volume of methyl ethyl ketone and isopropanol. The resulting 5000 Angstrom thick patterned resist had a resolution of 2 microns.

We claim:

1. Article comprising a substrate coated with an x-ray curable material having a thickness of at least 0.5 microns and is CHARACTERIZED IN THAT said x-ray curable material consists essentially of a mixture of a first polymer, said first polymer being poly(2,3-dichloro-1-propyl acrylate), said poly(2,3-dichloro-1-propyl acrylate) having a weight average molecular weight between 300,000 and 3,500,000, and a second polymer, said second polymer being poly(glycidyl methacrylate-co-ethyl acrylate), said poly(glycidyl methacrylate-co-ethyl acrylate) constituting between 1 percent and 20 percent, by weight, of said mixture.

2. Article as recited in claim 1 in which said second polymer constitutes approximately 7.5 percent, by weight, of said mixture.

3. Article as recited in claim 1 or 2 in which the ratio of the mole percent of glycidyl acrylate:ethyl acrylate in said COP is approximately 70:30.

4. Article as recited in claim 3 in which said COP has a weight average molecular weight of approximately 150,000 g/mole.

5. Article as recited in claim 1 in which said DCPA has a weight average molecular weight of approximately 2,900,000 g/mole.

6. Article as recited in claim 1 or 2 in which said substrate consists essentially of a semiconductor.

7. Article as recited in claim 6 in which said semiconductor consists essentially of silicon.

8. Article as recited in claim 7 in which said substrate comprises a semiconductor covered by a layer of silicon dioxide.

9. Article as recited in claim 8 in which said semiconductor consists essentially of silicon.

10. Process for pattern delineating a substrate coated with a negative resist material having a thickness of at least 0.5 microns comprising the steps of exposing selected portions of said resist material to radiation which causes said exposed portions to become less easily removable with respect to the unexposed portions, in which said resist consists essentially of a polymer;

removing the unexposed portions; and processing the pattern delineated resist and substrate with processing steps that alter the bared substrate areas CHARACTERIZED IN THAT said resist material consists essentially of a mixture of a first polymer, said first polymer being poly(2,3-dichloro-1-propyl acrylate), said poly(2,3-dichloro-1-propyl acrylate) having a weight average molecular weight between 300,000 and 3,500,000, and a second polymer, said second polymer being poly(glycidyl methacrylate-co-ethyl acrylate), said poly(glycidyl methacrylate-co-ethyl acrylate) constituting between 1 percent and 20 percent by weight, of said mixture.

11. Process of claim 10 in which said processing results in the deposition of material on bared portions of the substrate.

12. Process of claim 10 in which said processing results in removal of a layer of the bared substrate.

13. Process of claim 12 in which said processing further results in the deposition of material on said bared portions of said substrate.

14. Process of claim 11 or 13 in which said substrate consists essentially of a semiconductor.

15. Process of claim 11 or 14 in which said deposition is by ion implantation.

16. Process of claim 11 or 14 in which the deposited material is diffused into said substrate.

17. Process of claim 12 in which said layer consists essentially of silicon dioxide.

18. Process of claim 17 in which said layer of silicon dioxide covers a semiconducting substrate.

19. Process of claim 18 in which said semiconducting substrate consists essentially of silicon.

20. Process of claim 12 further comprising repeating the exposing, removing and processing steps.

21. Process of claim 20 in which at least one of said layers consists essentially of a metal.

22. Process of claim 13 further comprising repeating the exposing, removing and processing steps.

23. Process of claim 13 in which said processing further includes deposition of a metal layer on said substrate.

24. Process of claim 23 in which portions of said metal layer are selectively removed.

25. Process of claim 12 in which said removal is by ion milling.

26. Process of claim 12 in which said substrate consists essentially of a metal.

* * * * *